United States Patent
Shi et al.

(10) Patent No.: US 10,274,687 B1
(45) Date of Patent: Apr. 30, 2019

(54) HIGHLY INTEGRATED MULTI-CHANNEL OPTICAL TRANSCEIVER MODULE AND ACTIVE OPTICAL CABLE BASED ON SILICON PHOTONIC CHIP

(71) Applicants: Jiangsu Hengtong Optical Network Technology Co., Ltd., Suzhou (CN); Jiangsu Hengtong Optic-Electric Co., Ltd., Suzhou (CN)

(72) Inventors: Weiming Shi, Suzhou (CN); Xiaohan Shen, Suzhou (CN); Hu Xu, Suzhou (CN); Quan Sun, Suzhou (CN); Yinzhou Cai, Suzhou (CN); Xiaojia Yang, Suzhou (CN)

(73) Assignees: Jiangsu Hengtong Optical Network Technology Co., Ltd., Suzhou (CN); Jiangsu Hengtong Optic-Electric Co., Ltd., Suzhou (CN)

( * ) Notice: Subject to any disclaimer, the term of this patent is extended or adjusted under 35 U.S.C. 154(b) by 0 days.

(21) Appl. No.: 15/873,133

(22) Filed: Jan. 17, 2018

(30) Foreign Application Priority Data

Nov. 20, 2017 (CN) .......................... 2017 1 1152841

(51) Int. Cl.
*G02B 6/42* (2006.01)
*G02F 1/025* (2006.01)
(Continued)

(52) U.S. Cl.
CPC .......... *G02B 6/4246* (2013.01); *G02B 6/428* (2013.01); *G02B 6/4243* (2013.01);
(Continued)

(58) Field of Classification Search
CPC .... G02B 6/4246; G02B 6/4292; G02B 6/428; G02B 6/4243; G02B 6/4249; H04B 10/70; H04B 10/2503; H04B 10/40; G02F 1/025; G02F 2001/0157; H01S 5/4025; H01S 5/3427; H01S 5/0224; H01S 5/021
(Continued)

(56) References Cited

U.S. PATENT DOCUMENTS

| | | | | |
|---|---|---|---|---|
| 2015/0341123 | A1* | 11/2015 | Nagarajan | H04B 10/70 398/43 |
| 2017/0357064 | A1* | 12/2017 | Nagarajan | H04B 10/40 |
| 2019/0033542 | A1* | 1/2019 | Epitaux | G02B 6/3518 |

* cited by examiner

*Primary Examiner* — Juan A Torres
(74) *Attorney, Agent, or Firm* — SZDC Law P.C.

(57) ABSTRACT

A highly integrated multi-channel optical transceiver module based on silicon photonic chip technology includes an integrated silicon photonic chip, an integrated circuit chip, and a printed circuit board assembly. The integrated silicon photonic chip and the integrated circuit chip are both integrated on silicon substrates and are furthered bonded on printed circuit board assembly. The integrated silicon photonic chip includes a silicon photonic transmitter chip and a silicon photonic receiver chip that both connected to optical fiber connectors through the optical fiber patch cord jumpers. The integrated circuit chip includes an integrated circuit transmitter chip that connected to the silicon photonic transmitter chip through a wire bonding, and an integrated circuit receiver chip that connected to the silicon photonic receiver chip through a wire bonding. The present invention provides a high-data-rate, low-power-consumption, and cost-effective solution for optical transceiver modules and active optical cables based on silicon photonic chip technology.

9 Claims, 6 Drawing Sheets

(51) Int. Cl.
| | |
|---|---|
| *H01S 5/40* | (2006.01) |
| *H01S 5/022* | (2006.01) |
| *H01S 5/02* | (2006.01) |
| *H04B 10/40* | (2013.01) |
| *H04B 10/25* | (2013.01) |
| *H04B 10/70* | (2013.01) |
| *H01S 5/34* | (2006.01) |
| *G02F 1/015* | (2006.01) |

(52) U.S. Cl.
CPC ......... *G02B 6/4249* (2013.01); *G02B 6/4292* (2013.01); *G02F 1/025* (2013.01); *H01S 5/021* (2013.01); *H01S 5/0224* (2013.01); *H01S 5/3427* (2013.01); *H01S 5/4025* (2013.01); *H04B 10/2503* (2013.01); *H04B 10/40* (2013.01); *H04B 10/70* (2013.01); *G02F 2001/0157* (2013.01)

(58) Field of Classification Search
USPC ........................................................ 398/139
See application file for complete search history.

HIGHLY INTEGRATED MULTI-CHANNEL OPTICAL TRANSCEIVER MODULE AND ACTIVE OPTICAL CABLE BASED ON SILICON PHOTONIC CHIP

This application claims priority to Chinese Patent Application No. CN 201711152841.4, filed on Nov. 20, 2017, which is incorporated by reference for all purposes as if fully set forth herein.

BACKGROUND OF THE INVENTION

1. Field of the Invention

The present invention relates to the field of communications, and in particular, to a highly integrated multi-channel optical transceiver module and an active optical cable (AOC) based on silicon photonic chip.

2. Description of the Related Art

With the rapid development of technologies such as big data, cloud computing, Internet of Things, and 5G mobile communications, network data traffic grows rapidly accordingly. In this case, interconnection among broadband access, metropolitan area networks, backbone networks, and data centers requires significant increases in requirements of bandwidths and rates in data communication. Currently, the global fiber-optic communication industry is developing towards high integration and low power consumption. Optical communications devices are upstream products in the optical communications industry, and play critical roles in the field of data communication. Therefore, how to implement the miniaturization, integration, low power consumption, and low costs of optical communications devices has become an urgent demand in the current optical communication industry and even the data-as-a-service market.

Optical modules and AOCs are effective solutions in optical communication and interconnection. The production of optical modules and AOCs depends on the optical device industry. A conventional optical device production model has a "discrete" feature, and structural units including modulators/demodulators, semiconductor lasers, detectors, and amplifiers of current common optical devices are all separately manufactured by using completely different processes, and are for example, lasers manufactured based on an indium phosphide (chemical formula: InP) material, optical signal modulators manufactured based on a lithium niobate (chemical formula: $LiNO_3$) material, wavelength-division multiplexers manufactured based on a carbon dioxide/silicon (chemical formula: $SiO_2/Si$) material and an indium gallium arsenide phosphide/indium phosphide (chemical formula: InGaAsP/InP) material, and photodetectors manufactured based on materials such as germanium/silicon (chemical formula: Ge/Si) and gallium arsenide (chemical formula: GaAs). These discrete units are manufactured and then assembled into optoelectronic modules. In these processes, intensive human labor is required. Consequently, there are a series of disadvantages such as high costs, large sizes, low reliability, and limited performance.

In another aspect, from the perspective of process standards, due to the lack of a universal process standard, optical device companies adopt a "small workshop" operation and development model to save costs, resulting in low product yields, low production, and a compatibility problem between different products. In addition, any enterprise that is engaged in the field of the optical device industry is required to have an ultra-clean room and an entire set of metal organic chemical vapor deposition (MOCVD) equipment. Manufacturers need to be responsible for materials, processes, designs, quality, and product yields. Such a "vertical integration" business model causes an imbalance between an investment scale and an output, and causes high capital investment and operation costs of each manufacturer, and no scale effect is achieved. Therefore, optical devices have high costs, low production, and unsatisfying profit of single production lines. Moreover, there is no flexibility and the tolerance to fluctuating market demand is low.

A silicon photonic chip technology is different from a conventional production process of optical communication devices with separate production and assembly, which integrates technologies of a silicon on insulator (SOI) process platform and a complementary metal-oxide-semiconductor (CMOS) process platform, so that the development and production of integrated photonic chips are properly integrated with the current mainstream semiconductor industry, so as to provide new solutions to high-bandwidth, high-rate, low-cost, and low-energy-consumption optical communication industry. In the so-called silicon-based optoelectronics, extremely-high bandwidths, ultra-high rates, and high anti-interference property of light and advantages of the microelectronics technology in aspects of large scales, low energy consumption, and low costs are combined, and the silicon-based large-scale optical circuit integration technology that uses photons and electrons as information carriers are studied and developed. The core content of silicon-based optoelectronics is to study how to "miniaturize" and "siliconize" optoelectronic devices and integrate optoelectronic devices and nanometer scale electronic devices. That is, information function devices that use silicon or other materials compatible with silicon and use photons and electrons as carriers to form one complete novel large-scale optical integrated circuit chip with a comprehensive function.

SUMMARY OF THE INVENTION

A technical problem to be resolved by the present invention is to provide a highly integrated multi-channel optical transceiver module and an AOC based on silicon photonic chip, so as to provide, based on an advanced silicon photonic chip integration technology, a 100-Gbps high-speed silicon photonic transceiver and an AOC that are integrated, which have low power consumption and low costs.

To resolve the foregoing technical problem, the present invention provides a highly integrated multi-channel optical transceiver module of a silicon photonic chip, including: an integrated silicon photonic chip, an integrated circuit chip, and a printed circuit board assembly, where the integrated silicon photonic chip and the integrated circuit chip are both integrated on the printed circuit board assembly, the integrated silicon photonic chip includes a silicon photonic transmitter chip and a silicon photonic receiver chip, the integrated electronic chip includes an integrated circuit transmitter chip and an integrated circuit receiver chip, the integrated circuit transmitter chip is connected to the silicon photonic transmitter chip through wire bonding, the silicon photonic transmitter chip is connected to an optical fiber connector through an optical fiber jumper, the integrated circuit receiver chip is connected to the silicon photonic receiver chip through wire bonding, and the silicon photonic receiver chip is connected to the optical fiber connector through an optical fiber jumper.

Preferably, the silicon photonic transmitter chip includes: a distributed feedback laser array, a Ge/Si waveguide electro-absorption modulator array, and a thermal-insulation V-shaped groove of optical fiber connector array;

the silicon photonic receiver chip includes: a Ge waveguide optoelectronic detector array and a thermal-insulation V-shaped groove of optical fiber connector array;

the integrated circuit transmitter chip includes: a Ge/Si electro-absorption modulator driver array, clock and data recovery (CDR), a CMOS amplifier, a non-return-to-zero code (NRZ) rectification signal input, and an NRZ rectification signal output; and the integrated circuit receiver chip includes: a transimpedance amplifier, CDR, a CMOS amplifier, an NRZ signal input, and an NRZ rectification signal output.

Preferably, a light source of the distributed feedback laser array is a Ge/Si multiple-quantum-well distributed feedback laser, the distributed feedback laser sequentially includes, from a bottom layer to a top layer: a silicon substrate, a carbon dioxide layer, a silicon waveguide, an n-type silicon contact layer, an intrinsic silicon layer, a Ge/Si multiple-quantum-well layer, an intrinsic silicon layer, and a P-type silicon contact layer, where a multi-channel Ge/Si multiple-quantum-well layer is directly grown on the silicon substrate, and is flip-chip-bonding on the silicon waveguide.

Preferably, the Ge/Si waveguide electro-absorption modulator array is compatible with a CMOS amplifier, an NRZ modulation frequency of a single-channel Ge/Si waveguide electro-absorption modulator reaches 30 Gbps, a peak extinction ratio is 7.5 dB, a radio frequency (RF) modulation bandwidth is less than 40 GHz, a base of a Ge/Si waveguide electro-absorption modulator is in trench shape, one Ge modulator is disposed on an upper surface of the trench, one free end of the Ge modulator is level with one lateral side of the trench, the other free end of the Ge modulator is joined with a short side of the Si conical body, the long side of the Si conical body is joined with the SOI waveguide, and the SOI waveguide is level with the other lateral side of the trench.

Preferably, the thermal-insulation V-shaped groove of optical fiber connector array is integrated on the silicon photonic transmitter chip and the silicon photonic receiver chip, the thermal-insulation V-shaped groove of optical fiber connector array includes several V-shaped grooves, one SOI waveguide is disposed in each V-shaped groove, and a coupling loss between each single-mode optical fiber in the V-shaped groove and the SOI waveguide is less than 1 dB.

Preferably, the Ge waveguide optoelectronic detector array is integrated on the silicon photonic receiver chip, the Ge waveguide optoelectronic detector array is compatible with a CMOS amplifier, whose RF bandwidth is less than 40 GHz, and the wavelength detection range is between 1270 nm and 1600 nm.

Preferably, the Ge/Si electro-absorption modulator driver array consists of a CDR and a 28-nm CMOS amplifier integrated on a silicon-based chip, and supports a 4×25-Gbps NRZ rectification signal input function and a 4×25-Gbps NRZ signal output function.

Preferably, the transimpedance amplifier integrates a CDR and a 28-nm CMOS amplifier, supporting a 4×25-Gbps NRZ rectification signal input function and a 4×25-Gbps NRZ rectification signal output function.

Preferably, the printed circuit board assembly integrates one microcontroller chip and one direct current converter, and the integrated silicon photonic chip and the integrated circuit chip are connected to the printed circuit board assembly through die bonding and wire bonding.

Preferably, an AOC includes: an integrated silicon photonic chip, an integrated circuit chip, a printed circuit board assembly, and a G.655 8-core single-mode optical fiber, where the integrated silicon photonic chip includes a silicon photonic transmitter chip and a silicon photonic receiver chip, the integrated circuit chip includes an integrated circuit transmitter chip and an integrated circuit receiver chip, the integrated circuit transmitter chip is connected to the silicon photonic transmitter chip through wire bonding, the silicon photonic transmitter chip is connected to an optical cable consists of G.655 single-mode optical fibers, the integrated circuit receiver chip is connected to the silicon photonic receiver chip through wire bonding, and the silicon photonic receiver chip is connected to an optical cable consists of G.655 single-mode optical fibers;

The printed circuit board assembly integrates one microcontroller chip and one direct current converter, and the integrated silicon photonic chip and the integrated circuit chip are connected to the printed circuit board assembly through die bonding and wire bonding; and The G.655 8-core single-mode optical fibers are passively aligned and coupled to the laser array and the photodetector array through thermal-insulation V-shaped grooves.

Technical effects of the present invention are as follows:

1. In the present invention, a silicon photonic chip and an electronic chip that are integrated may be directly deposited on a silicon substrate. As compared with a conventional optoelectronic device, e.g., an active optical cable base on TOSA and ROSA packages, more than 50% of the components can be reduced. In addition, germanium/silicon distributed feedback laser involved in the present invention is compatible with silicon fabrication process and may be directly grown on the silicon substrate, and can further simplify a production procedure as compared with an external laser made by group III-V materials used in other solutions of silicon photonic integration.

2. By means of the present invention, batch and large-scale production can be performed for an optical transceiver and an AOC, thereby greatly reducing costs.

Figure 1:
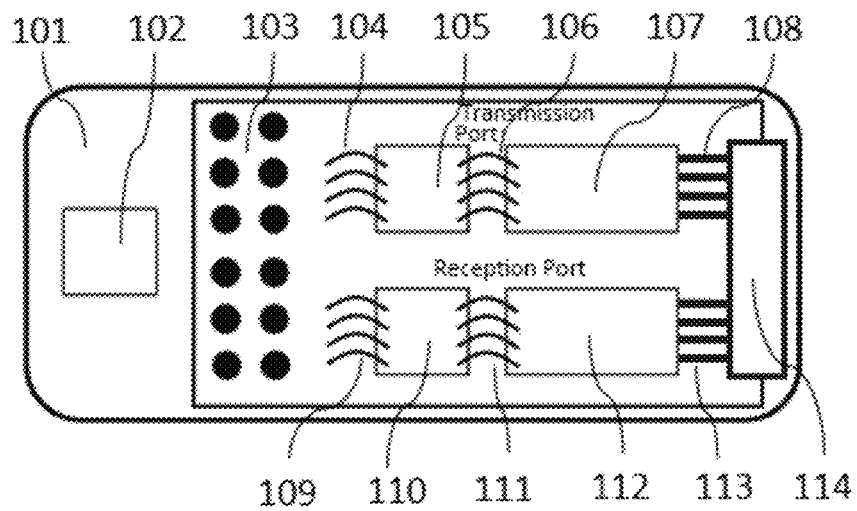
FIG. 1 is a structural block diagram of an optical transceiver according to the present invention.

101—Printed circuit board assembly, 102—Microcontroller, 103—Electrical solder joint, 104—Aluminum wire, 105—Integrated circuit transmitter chip, 106—Aluminum wire, 107—Silicon photonic transmitter chip, 108—Single-mode optical fiber jumper, 109—Aluminum wire, 110—Integrated circuit receiver chip, 111—Aluminum wire, 112—Silicon photonic receiver chip, 113—Single-mode optical fiber jumper, and 114—12-core MPO optical fiber connector.

201—Printed circuit board assembly, 202—Microcontroller, 203—Electrical solder joint, 204—Aluminum wire, 205—Integrated circuit transmitter chip, 206—Aluminum wire, 207—Silicon photonic transmitter chip, 208—G.655 single-mode optical fiber, 209—Optical cable leather cover, 210—Aluminum wire, 211—Integrated circuit receiver chip, 212—Aluminum wire, 213—Silicon photonic receiver chip, and 214—G.655 single-mode optical fiber.

301—Metal electrode, 302—P-type Si contact layer, 303—Intrinsic Si buffer layer, 304—Ge/Si multiple-quantum-well layer, 305—Intrinsic Si buffer layer, 306—Metal electrode, 307—N-type Si contact layer, 308—Silicon waveguide, 309—Carbon dioxide layer, and 310—Silicon substrate.

401—SOI waveguide, 402—Si conical body, 403—Ge modulator, 404—Metal electrode, 405—Trench, and 406—Metal electrode.

501—V-shaped groove, and 502—SOI waveguide.

601—Metal electrode, 602—Metal electrode, 603—SiO2 buffer layer, 604—Contact layer, 605—Metal electrode, 606—Absorption layer, 607—Charge layer, 608—Multiplication layer, 609—Si substrate, 610—Metal electrode.

701—Heat conduction sheet, 702—Packaging housing upper cover, 703—Unit having a silicon photonic chip and an integrated circuit chip, 704—Golden finger connector, 705—Printed circuit board assembly, 706—Microcontroller, 707—Packaging housing lower cover, 708—G.655 single-mode optical fiber jumper, 709—12-core MPO fiber connector, and 710—Packaging housing tail cover.

801—Heat conduction sheet, 802—Packaging housing upper cover, 803—Unit having an integrated silicon photonic chip and an integrated circuit chip, 804—Pull ring, 805—Golden finger connector, 806—Printed circuit board assembly, 807—Microcontroller, 808—Packaging housing lower cover, 809—G.655 single-mode optical fiber array, 810—Optical cable fixture, and 811—Packaging housing tail cover.

DETAILED DESCRIPTION OF THE PREFERRED EMBODIMENTS

The present invention is further described below with reference to the accompanying drawings and specific embodiments, to enable a person skilled in the art to better understand and implement the present invention. However, the embodiments are not used to limit the present invention.

Embodiments

In this embodiment, a highly integrated multi-channel optical transceiver of a silicon photonic chip is disclosed. The highly integrated multi-channel optical transceiver of a silicon photonic chip includes: an integrated silicon photonic chip, an integrated circuit chip, and a printed circuit board assembly 101. The integrated silicon photonic chip and the integrated circuit chip are both integrated on the printed circuit board assembly 101. The printed circuit board assembly 101 integrates one microcontroller chip 102 and one direct current converter, and several electrical solder joints 103 are further provided on the printed circuit board assembly 101. The integrated silicon photonic chip includes a silicon photonic transmitter chip 107 and a silicon photonic receiver chip 112. The integrated circuit chip includes an integrated circuit transmitter chip 105 and an integrated circuit receiver chip 110. The integrated circuit transmitter chip 105 is connected to the silicon photonic transmitter chip 107 through an aluminum wire 106. The silicon photonic transmitter chip 107 is connected to an optical fiber connector (a 12-core MPO optical fiber connector) through an optical fiber jumper (a single-mode optical fiber jumper 108). The integrated circuit receiver chip 110 is connected to the silicon photonic receiver chip 112 through an aluminum wire 111. The silicon photonic receiver chip 112 is connected to the optical fiber connector through an optical fiber jumper (a single-mode optical fiber jumper 113).

Several electrical solder joints 103 are further provided on the foregoing optical transceiver module. The integrated circuit transmitter chip 105 is further integrated on the printed circuit board assembly 101 through an aluminum wire 104. Similarly, the integrated circuit receiver chip 110 is integrated on the printed circuit board assembly 101 through an aluminum wire 109.

In this embodiment, the silicon photonic transmitter chip includes: a distributed feedback laser array, a Ge/Si waveguide electro-absorption modulator array, and a thermal-insulation V-shaped groove optical fiber connector array. The silicon photonic receiver chip includes: a Ge waveguide optoelectronic detector array and a thermal-insulation V-shaped groove optical fiber connector array. The integrated circuit transmitter chip includes: a Ge/Si electro-absorption modulator driver array, CDR, a CMOS amplifier, an NRZ rectification signal input, and an NRZ rectification signal output. The integrated circuit receiver chip includes: a transimpedance amplifier, CDR, a CMOS amplifier, an NRZ signal input, and an NRZ rectification signal output.

A light transmission port includes the silicon photonic transmitter chip 107 and the integrated circuit transmitter chip 105. The two chips are wire-bonded through the aluminum wire 106. A light reception port includes the silicon photonic receiver chip 112 and the integrated circuit receiver chip 110. The two chips are wire-bonded through the aluminum wire 111. The transmission port integrated circuit chip is wire-bonded to a silicon substrate through the aluminum wire 104, and the reception port integrated circuit chip is wire-bonded to the silicon substrate through the aluminum wire 109.

Figure 2:
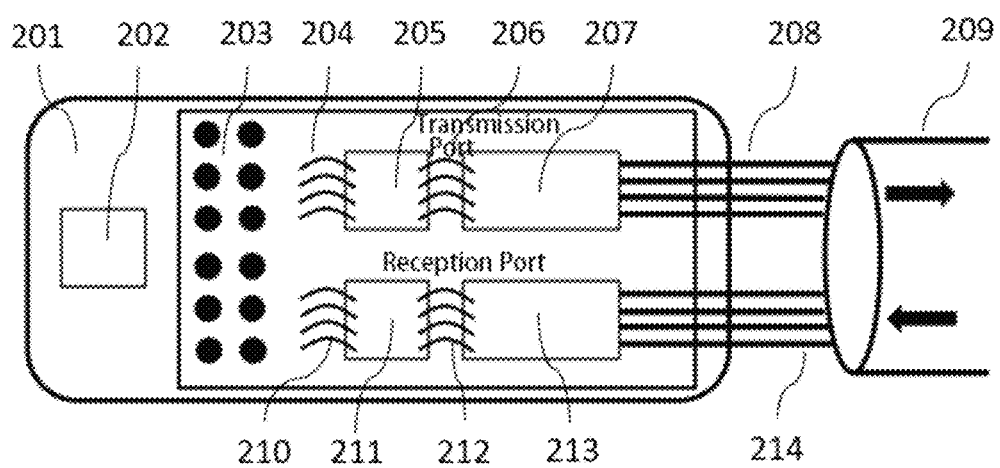
FIG. 2 is a structural block diagram of an AOC according to the present invention.

As shown in FIG. 2, a structure of an AOC includes: an integrated silicon photonic chip, an integrated circuit chip, a printed circuit board assembly 201, and a G.655 8-core single-mode optical fiber. The integrated silicon photonic chip includes a silicon photonic transmitter chip 207 and a silicon photonic receiver chip 213. The integrated circuit chip includes an integrated circuit transmitter chip 205 and an integrated circuit receiver chip 211. The integrated circuit transmitter chip 205 is connected to the silicon photonic transmitter chip 207 through an aluminum wire 206. The silicon photonic transmitter chip 207 is connected to a leather-covered optical cable 209 through a G.655 single-mode optical fiber 208.

The integrated circuit receiver chip 211 is connected to the silicon photonic receiver chip 213 through an aluminum wire 212, and the silicon photonic receiver chip 213 is connected to a leather-covered optical cable 209 through a G.655 single-mode optical fiber 214.

The integrated circuit transmitter chip 205 is further wire-bonded on the printed circuit board assembly 201 through an aluminum wire 204. Similarly, the integrated circuit receiver chip 211 is wire-bonded on the printed circuit board assembly 201 through an aluminum wire 210.

The printed circuit board assembly 201 integrates one microcontroller chip 202 and one direct current converter, and several electrical solder joints 203 are further provided on the printed circuit board assembly 201. The integrated silicon photonic chip and the integrated circuit chip are connected to the printed circuit board assembly 201 through die-bonding and wire-bonding. The G.655 8-core single-mode optical fiber is passively aligned and coupled to a laser array and an photodetector array through a thermal-insulation V-shaped groove array.

Figure 3:
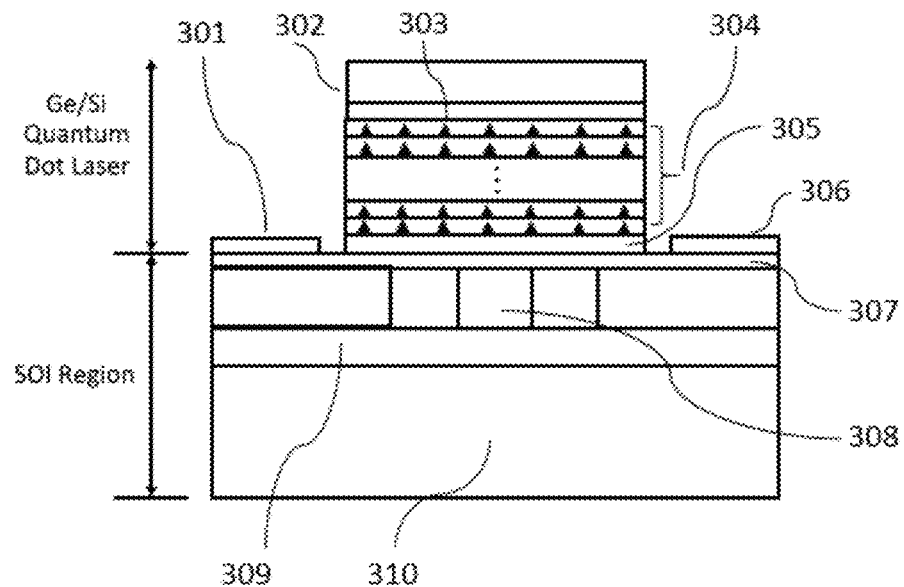
FIG. 3 is a schematic structural diagram of a Ge/Si multiple-quantum-well distributed feedback laser (DFB) laser according to the present invention.

Referring to FIG. 3, the light source in the DFB laser array is a Ge/Si multiple-quantum-well laser. The distributed feedback laser sequentially includes, from a bottom layer to a top layer: a silicon substrate 310, a carbon dioxide layer 309, a silicon waveguide, an n-type silicon contact layer, an intrinsic silicon layer, a Ge/Si multiple-quantum-well layer, an intrinsic silicon layer, and a P-type silicon contact layer. A multi-channel Ge/Si multiple-quantum-well layer is directly grown on the silicon substrate, and is flip-bonded on the silicon waveguide.

Specifically, as shown in FIG. 3, the DFB laser is a stacked multiple-quantum-well structure, that is, an optical gain medium. An upper layer structure of the DFB laser is a p-type semiconductor layer, a middle layer of the DFB laser is a Ge/Si multiple-quantum-well layer 304, and a lower layer of the DFB laser is an n-type semiconductor layer 307. The p-type semiconductor layer includes, from top to bottom: one p-type Si contact layer 302, where the thickness of the p-type Si contact layer 302 is 0.2 µm, and the doping concentration of boron (chemical formula: B) is $1 \times 10^{19}$ cm$^{-3}$; and one intrinsic Si buffer layer 303, where a thickness of the intrinsic Si buffer layer 303 is 0.1 µm. The Ge/Si multiple-quantum-well layer 304 includes, from top to bottom: 20 layers of identical quantum well layer, where each quantum well layer contains 7 Ge single atomic layers, and the doping concentration of phosphorus (chemical formula: P) is $1 \times 10^{18}$ cm$^{-3}$; and one 17-nm-thick intrinsic Si isolation layer. The n-type semiconductor layer includes, from top to bottom: one intrinsic Si buffer layer 305, where the thickness of the intrinsic Si buffer layer 305 is 0.1 µm; and one n-type Si contact layer 307, where the thickness of the n-type Si contact layer 307 is 0.2 µm, and the P-doping concentration is $1 \times 10^{19}$ cm$^{-3}$. The optical gain medium is directly bonded to a silicon-based waveguide 308, so as to guide the excited light out from the gain medium.

Moreover, the DFB laser further has a metal electrode 301 and a metal electrode 306. The metal electrode 301 and the metal electrode 306 are disposed at two ends of the n-type Si contact layer 307, respectively.

Further, steps of fabricating a Ge/Si multi-channel DFB laser are as follows:

Step 1: Manufacture a structure of a Si waveguide on the (100) crystal surface of a non-doped SOI substrate by using a standard light lithography technique and a plasma and reactive ion etching (PRIE) technique with chlorine gas/argon gas/hydrogen bromide (chemical formula: $Cl_2$/Ar/HBr), where the height of the Si waveguide is 0.76 µm, and the width of the Si waveguide is 2.5 µm.

Step 2: Grow a 0.1-µm-thick intrinsic Si buffer layer on a Si substrate by using the ultra-high vacuum chemical vapor deposition (UHV-CVD) technique, and gradually grow 20 multiple-quantum-well layers on the buffer layer. Each quantum well layer contains 7 Ge single atomic layers and one 17-nm-thick intrinsic Si isolation layer, where temperatures in the above layer-growing processes of are controlled at 520° C. and 580° C. respectively, and the growth rate is 0.0056 nm/s.

Step 3: Flip-bond a Ge/Si multiple-quantum-well layer on a SOI waveguide.

Step 4: Deposit a nickel/aluminum (chemical formula: Ni/Al) metal layer on the Si substrate, to form the metal electrode 301 and the metal electrode 306.

In this embodiment, the foregoing laser is formed of an optical gain medium and a SOI waveguide. The optical gain medium is formed of a Ge/Si multiple-quantum-well, and includes a p-type Si layer, an intrinsic Si layer, a Ge/Si multiple-quantum-well layer, and an intrinsic Si layer. Because Si is an indirect band gap semiconductor, and photon-to-electron conversion of Si requires the involvement of phonons. As a result, the light-emission efficiency of Si is not high. However, Ge is a semiconducting material with a band-structure of a pseudo-direct band gap. Therefore, Ge has many advantages over Si in terms of optical and electrical characteristics. Ge has higher electron and hole mobility than Si does: Electron mobility and hole mobility of Ge are 3900 cm$^2$V$^{-1}$s$^{-1}$ and 1900 cm$^2$V$^{-1}$s$^{-1}$ respectively. Electron mobility and hole mobility of Si are only 1417 cm$^2$V$^{-1}$s$^{-1}$ and 471 cm$^2$V$^{-1}$s$^{-1}$ respectively. In another aspect, Ge is a Group-IV element, and a lattice mismatch rate between Ge and Si is only 4.2%. Consequently, Ge has a characteristic of complete process compatibility with Si. As compared with a conventional Group III-V element laser, which is incompatible with Si process, Ge is more suitable for silicon photonic integration. Therefore, Ge is an optimal choice of light source for the silicon photonic chip. A Ge/Si multiple-quantum-well DFB laser array is directly flipped and grown on the SOI waveguide. An external electrical field excites the p-type Si layer at the top to transmit laser. The power of the laser is amplified in the gain medium, and the laser is then guided in the underneath SOI waveguide and is transmitted from a transmission port.

Figure 4:
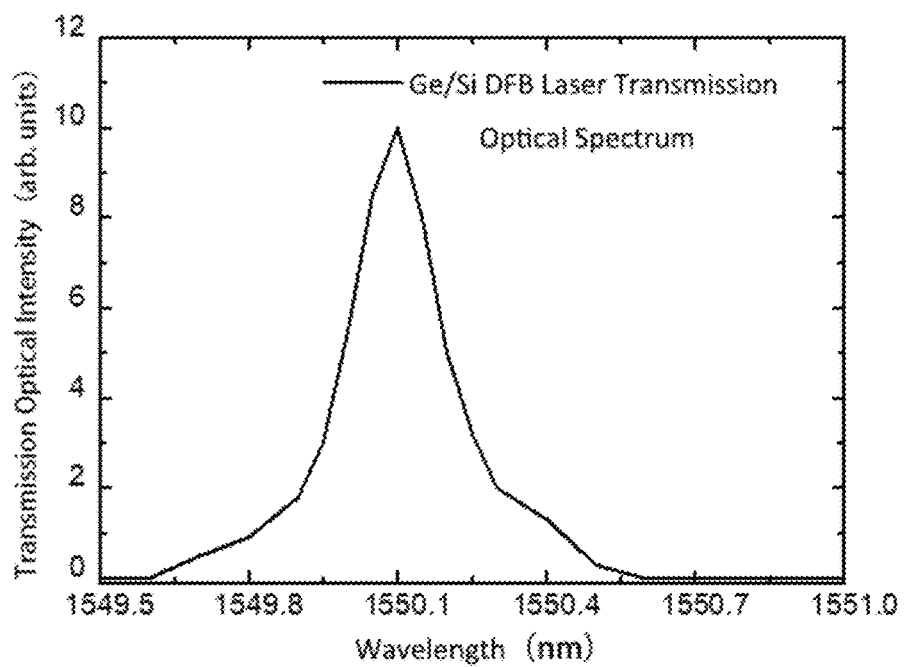
FIG. 4 shows the light-emission spectrum of a Ge/Si multi-channel DFB laser according to the present invention.

As shown in FIG. 4, the working performance of a Ge/Si multi-channel DFB laser is illustrated. A central wavelength of the Ge/Si multi-channel DFB laser is about 1550 nm, an optical spectral width of the Ge/Si multi-channel DFB is less than 0.3 nm, and an average transmission optical power of the Ge/Si multi-channel DFB laser is 40 mW.

By changing the doping concentration in the quantum well layer, the central transmission wavelength of the laser may be adjusted. In addition, the relation between the transmission optical power of the DFB laser and the bias current presents a desirable linear behavior.

Figure 5:
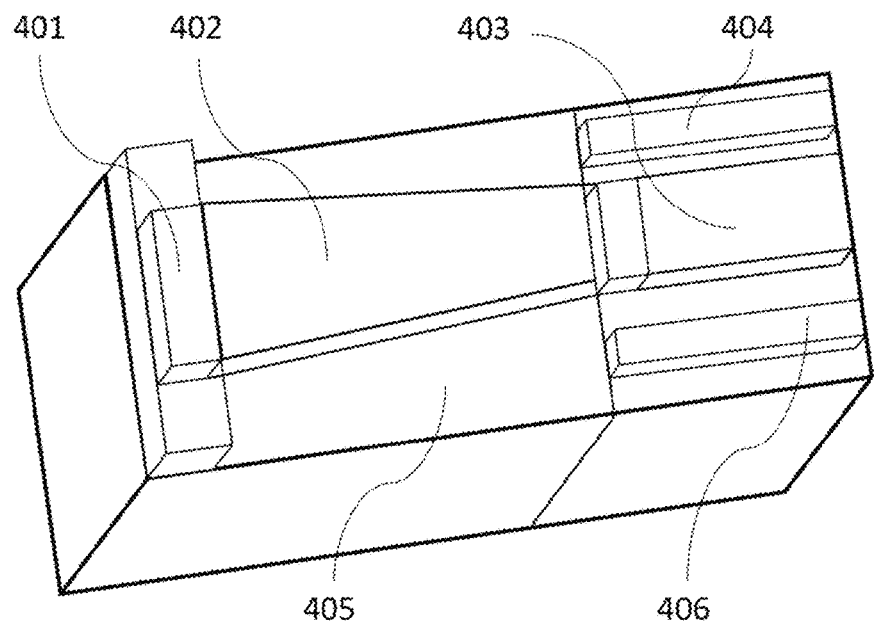
FIG. 5 is a schematic structural diagram of a Ge/Si electro-absorption modulator according to the present invention.

As shown in FIG. 5, the Ge/Si waveguide electro-absorption modulator array is compatible with a CMOS amplifier. An NRZ modulation frequency of a single-channel Ge/Si waveguide electro-absorption modulator reaches up to 30 Gbps. The peak extinction ratio is 7.5 dB. The RF modulation bandwidth is less than 40 GHz. The base of the Ge/Si waveguide electro-absorption modulator is the trench 405. One Ge modulator 403 is disposed on an upper surface of the trench 405. One free end of the Ge modulator 403 is level with one lateral side of the trench 405. The other free end of the Ge modulator 403 is joined with the short side of the Si conical body 402. The long side of the Si conical body 402 is joined with the SOI waveguide 401. The SOI waveguide 401 is level with the other lateral side of the trench 405. The metal electrode 404 and the metal electrode 406 are further provided on the trench 405. The metal electrode 404 and the metal electrode 406 are disposed on two sides of the Ge modulator 403, respectively.

The on/off of light in a Ge/Si electro-absorption modulator is controlled by an external electrical field. When there is an electrical field, light may be converted into electricity, so as to block the light from passing through the modulator. When there is no electrical field, the Ge/Si electro-absorption modulator works as a waveguide, and light may freely pass through the modulator.

As shown in FIG. 5, the structure and principles of the Ge/Si electro-absorption modulator is illustrated. Light in a communication wavelength range may be effectively modulated through direct band gap transition of germanium. The modulation principle of the Ge/Si electro-absorption modulator is based on the Franz-Keldysh effect. A modulation rate of the Ge/Si electro-absorption modulator may reach up to 30 GHz. The insertion loss and the extinction ratio of the Ge/Si electro-absorption modulator are 2.5 dB to 5 dB and 4 dB to 7.5 dB respectively, within the wavelength range of 1510 nm to 1640 nm. In addition, the dynamic energy consumption of the Ge/Si electro-absorption modulator is 100 fJ/bit, and the power consumption in the working condition of 25-Gbps modulation rate is 2.5 mW.

Further, steps of fabricating the Ge/Si electro-absorption modulator are as follows:

Step 1: Etch one 3-µm-high Si conical body 402 on a SOI die, and prepare for epitaxial growth in a selected region of Ge.

Step 2: Grow a 100-nm-thick Ge buffer layer in the groove region, where the growth temperature is 400° C.; subsequently, grow a 3-µm-thick Ge layer at a 670° C. temperature condition.

Step 3: Fabricate one 2.4-µm-high Ge waveguide and one SOI waveguide 401 by using PRIE.

Step 4: Dope B and P in the Ge waveguide, where the doping concentration is $1\times10^{18}$ cm$^{-3}$, so as to form one transverse p-i-n structure, that is, the Ge modulator 403.

Step 5: Deposit and grow a titanium/aluminum (chemical formula: Ti/Al) metal layer in the doped region to obtain the metal electrode 404 and the metal electrode 406 for use as contact electrodes of a p-type layer and an n-type layer.

Figure 6:
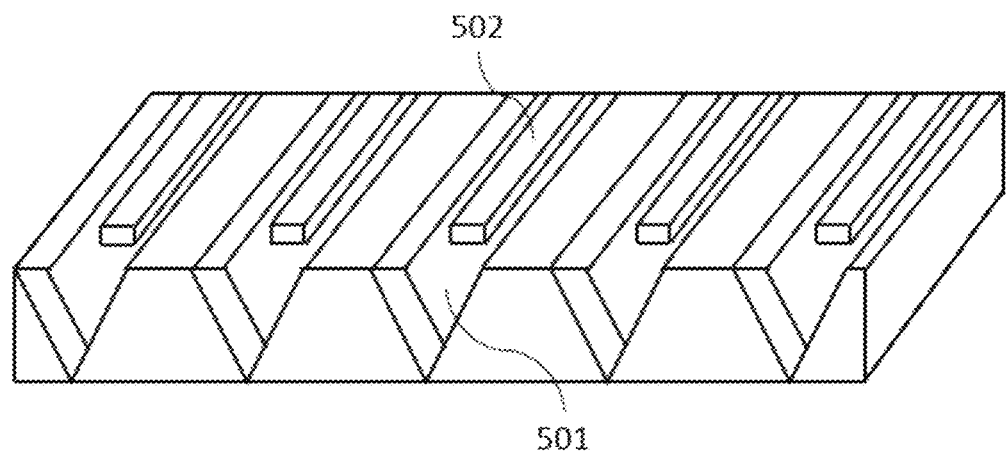
FIG. 6 is a schematic structural diagram of a thermal-insulation V-shaped groove optical fiber connector array according to the present invention.

Referring to FIG. 6, the thermal-insulation V-shaped groove optical fiber connector array involved in this embodiment is described. The thermal-insulation V-shaped groove optical fiber connector array is integrated on the silicon photonic transmitter chip and the silicon photonic receiver chip. The thermal-insulation V-shaped groove optical fiber connector array includes several V-shaped grooves 501. One SOI waveguide 502 is disposed in each V-shaped groove 501. The coupling loss between each single-mode optical fiber in the V-shaped groove 501 and the SOI waveguide 502 is less than 1 dB. A V-shaped groove is etched on a silicon substrate by using a standard light lithography technique. The position of the V-shaped groove is precisely aligned with the DFB laser array and the array of SOI waveguides 502 coupled to the photodetector array, where the alignment precision thereof in the horizontal direction is ±5 nm. An optical fiber may be directly inserted in the V-shaped groove 501 and is passively aligned and coupled to the array of SOI waveguides 502. The coupling loss between the optical fiber and the SOI waveguide 502 is less than 1 dB within the wavelength range of 1510 nm to 1570 nm.

The thermal-insulation V-shaped groove optical fiber connector array is grown to be joined with the SOI waveguide, and may passively align the transmitted light by the SOI waveguide and couple the light into an optical fiber. The feature of the thermal-insulation V-shaped groove optical fiber connector array is as follows: An optical lens is embedded and may adjust the size of the light spot to an optimal value, so as to minimize a coupling loss between the Si waveguide and the optical fiber array. Through the test, the insertion loss of each G.655 single-mode optical fiber in the thermal-insulation V-shaped groove is less than 1 dB.

Figure 7:
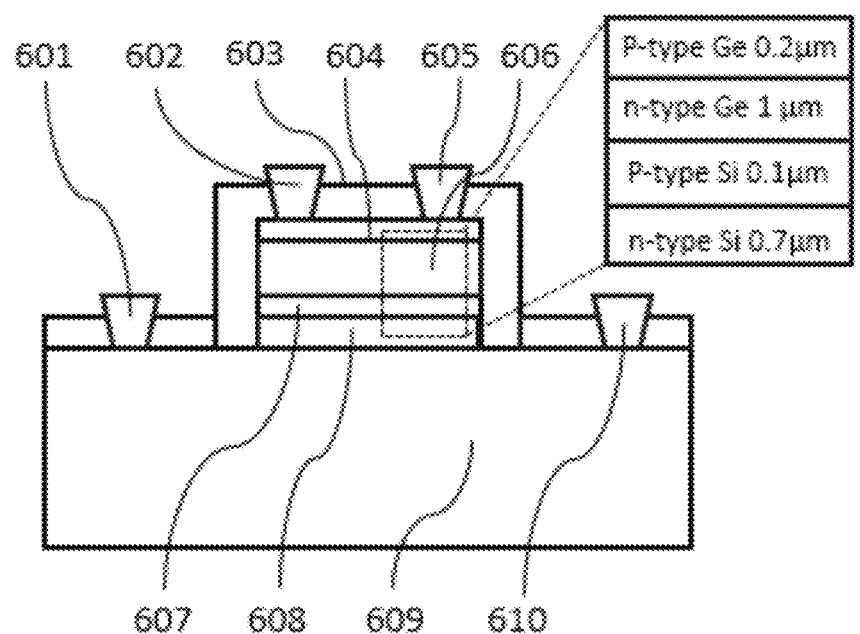
FIG. 7 is a schematic structural diagram of a Ge/Si optical detector according to the present invention.

Referring to FIG. 7, the structure and principles of the Ge/Si photodetector is illustrated. Steps of fabricating the Ge/Si photodetector are as follows: Step 1: Grow a 0.7-µm-thick intrinsic Si current multiplication layer 608 on a Si substrate 609 by using UHV-CVD technique, where the doping concentration of P is $1\times10^{16}$ cm$^{-3}$. Step 2: Deposit a 0.1-µm-thick p-type Si charge layer 607 on the current multiplication layer by using UHV-CVD technique, where the doping concentration of B is $1.6\times10^{17}$ cm$^{-3}$. Step 3: Deposit a 1-µm-thick intrinsic Ge absorption layer 606 on the charge layer by using UHV-CVD technique, where the doping concentration of P is $1\times10^{16}$ cm$^{-3}$. Step 4: Deposit a 0.2-µm-thick p-type Ge contact layer 604 on the absorption layer by using UHV-CVD technique, where the doping concentration of B is $1\times10^{18}$ cm$^{-3}$. Step 5: Grow a SiO2 buffer layer 603 on the absorption layer, and deposit a Ti/Al metal layer at two ends of a p-i-n structure respectively, to form a metal electrode 601, a metal electrode 602, a metal electrode 605, and a metal electrode 610.

Figure 8:
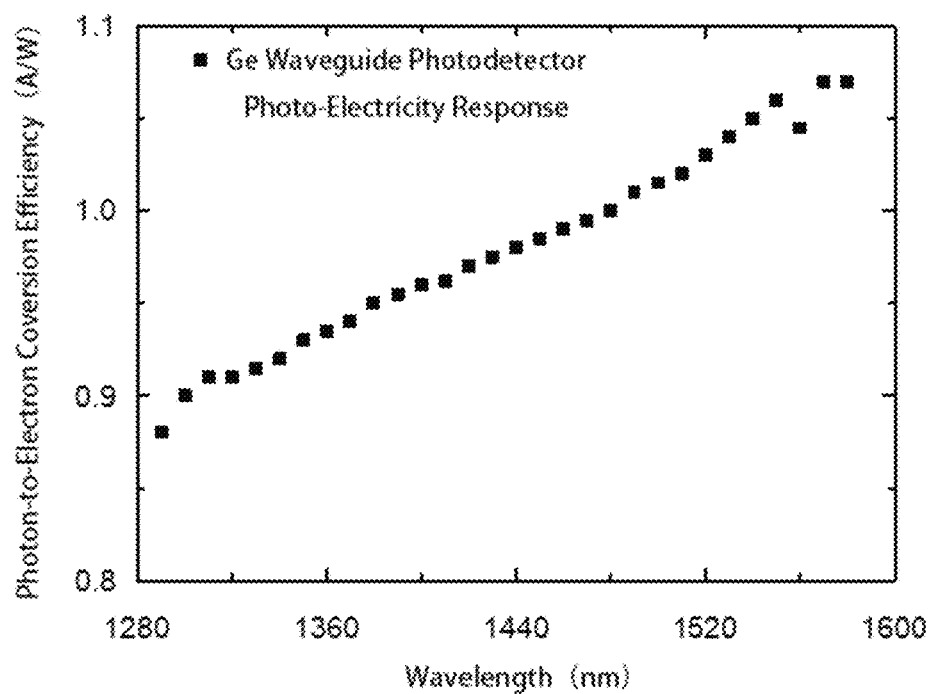
FIG. 8 shows responses of photon-to-electron conversion efficiency of a Ge/Si photodetector corresponding to a wavelength.

Referring to FIG. 8, the working performance of the Ge/Si photodetector is discussed. The Ge/Si photodetector has relatively high photon-to-electron conversion efficiency: When a bias voltage is 4 V, the photon-to-electron conversion efficiency of the Ge/Si photodetector is 0.91 A/W and 1.14 A/W, in wavelength windows of 1310 nm and 1550 nm, respectively. The Ge/Si photodetector has an ultra-high response rate, may support a data transmission rate of 40 Gb/s, and the response bandwidth may reach up to 33.6 GHz. In addition, the photon-to-electron conversion efficiency of the device presents a desirable linear relationship in a wavelength range from 1280 nm to 1580 nm.

Figure 9:
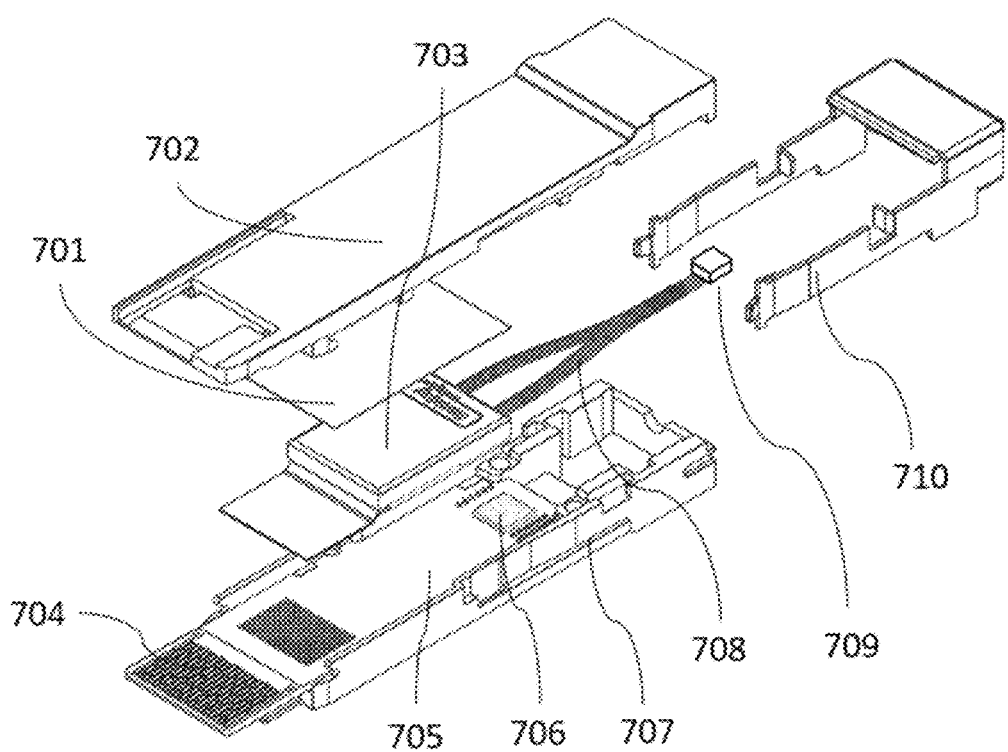
FIG. 9 is a schematic diagram of the structure, elements, and packaging of a 100-Gbps multi-channel high-rate optical transceiver according to the present invention.

Referring to FIG. 9, the components and the packaging instruction of the optical transceiver involved in this embodiment are described.

Step 1: Solder the unit 703 integrating a silicon photonic chip and an integrated circuit chip on the printed circuit board assembly 705. In addition, the microcontroller 706 is integrated in the printed circuits board assembly 705.

Step 2: Bond a heat conduction sheet 701 on the unit 703 having the silicon photonic chip and the integrated circuit chip.

Step 3: Strip a G.655 single-mode optical fiber jumper 708, insert one end of the G.655 single-mode optical fiber jumper 708 in thermal-insulation V-shaped groove optical fiber connector arrays at the transmission and the reception ports of the silicon photonic chip, and insert the other end of the G.655 single-mode optical fiber jumper 708 in the 12-core MPO optical fiber connector 709.

Step 4: Place the printed circuit board assembly 705 in the packaging housing lower cover 707, and assemble the packaging housing upper cover 702 and the packaging housing tail cover 710. The assembled optical transceiver can have interconnection with the external electronic devices through the golden finger connector 704.

Figure 10:
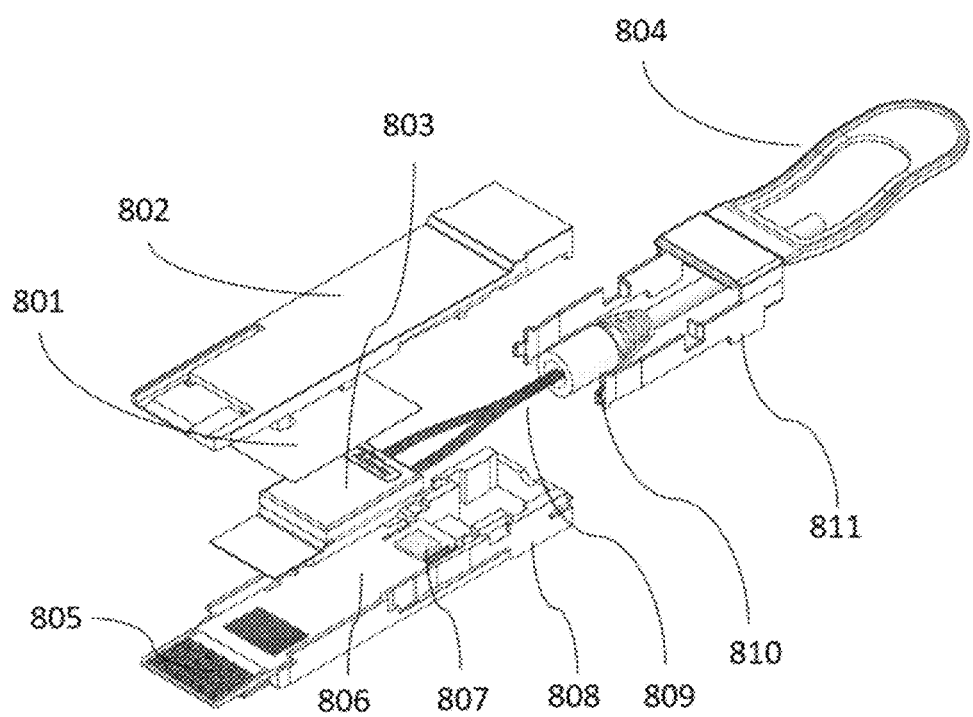
FIG. 10 is a schematic diagram of the structure, elements, and packaging of a 100-Gbps AOC according to the present invention.

Further, referring to FIG. 10, the components and a packaging instruction of the AOC involved in the present invention are described.

Step 1: Solder the unit 803 integrating a silicon photonic chip and an integrated circuit chip on the printed circuit board assembly 806. In addition, the microcontroller 807 is integrated in the printed circuits board assembly 806.

Step 2: Attach the heat conduction sheet 801 on the unit 803 having the silicon photonic chip and the integrated circuit chip.

Step 3: Strip a G.655 single-mode optical fiber jumper 809, insert one end of the G.655 single-mode optical fiber jumper 809 in thermal-insulation V-shaped groove optical fiber connector arrays of at the transmission and the reception ports of the silicon photonic chip, and insert the other end of the G.655 single-mode optical fiber jumper 809 in the optical cable fixture 810.

Step 4: Place the printed circuit board assembly 806 in the packaging housing lower cover 808, and cover the packaging housing upper cover 802, the packaging housing tail cover 811, and the pull ring 804. The assembled AOC can have interconnection with the external electronic devices through the golden finger connector 805.

The foregoing embodiments are merely preferred embodiments used to fully describe the present invention, and the protection scope of the present invention is not limited thereto. Equivalent replacements or variations made by a person skilled in the art to the present invention all fall within the protection scope of the present invention. The protection scope of the present invention is as defined in the claims.

What is claimed is:

1. A highly integrated multi-channel optical transceiver module of a silicon photonic chip, comprising: an integrated silicon photonic chip, an integrated circuit chip, and a printed circuit board assembly, wherein the integrated silicon photonic chip and the integrated circuit chip are both integrated on the printed circuit board assembly, the integrated silicon photonic chip comprises a silicon photonic transmitter chip and a silicon photonic receiver chip, the integrated circuit chip comprises an integrated circuit transmitter chip and an integrated circuit receiver chip, the integrated circuit transmitter chip is connected to the silicon photonic transmitter chip through wire bonding, the silicon photonic transmitter chip is connected to the optical fiber connector through an optical fiber jumper, the integrated circuit receiver chip is connected to the silicon photonic receiver chip through wire bonding, and the silicon photonic receiver chip is connected to the optical fiber connector through the optical fiber jumper.

2. The highly integrated multi-channel optical transceiver of a silicon photonic chip according to claim 1, wherein the silicon photonic transmitter chip comprises: a distributed feedback laser array, a Ge/Si waveguide electro-absorption modulator array, and a thermal-insulation V-shaped groove optical fiber connector array;

the silicon photonic receiver chip comprises: a Ge waveguide optoelectronic detector array and a thermal-insulation V-shaped groove optical fiber connector array;

the integrated circuit transmitter chip comprises: a Ge/Si electro-absorption modulator driver array, clock and data recovery (CDR), a complementary metal-oxide-semiconductor (CMOS) amplifier, an non-return-to-zero code (NRZ) rectification signal input, and an NRZ rectification signal output; and the integrated circuit receiver chip comprises: a transimpedance amplifier, CDR, a CMOS amplifier, an NRZ signal input, and an NRZ rectification signal output.

3. The highly integrated multi-channel optical transceiver module of a silicon photonic chip according to claim 1, wherein the printed circuit board assembly integrates one microcontroller chip and one direct current converter, and the integrated silicon photonic chip and the integrated circuit chip are connected to the printed circuit board assembly through die bonding and wire bonding.

4. The highly integrated multi-channel optical transceiver of a silicon photonic chip according to claim 2, wherein the light source in the distributed feedback laser array is a Ge/Si multiple-quantum-well laser, the distributed feedback laser sequentially comprises, from a bottom layer to a top layer: a silicon substrate, a carbon dioxide layer, a silicon waveguide, an n-type silicon contact layer, an intrinsic silicon layer, a Ge/Si multiple-quantum-well layer, an intrinsic silicon layer, and a P-type silicon contact layer, wherein the multi-channel Ge/Si multiple-quantum-well layer is directly grown on the silicon substrate, and is flip-bonded on the silicon waveguide.

5. The highly integrated multi-channel optical transceiver of a silicon photonic chip according to claim 2, wherein the Ge/Si waveguide electro-absorption modulator array is compatible with a CMOS amplifier, the NRZ modulation frequency of a single-channel Ge/Si waveguide electro-absorption modulator reaches up to 30 Gbps, the peak extinction ratio is 7.5 dB, a radio frequency (RF) modulation bandwidth is less than 40 GHz, a base of a Ge/Si waveguide electro-absorption modulator is a trench, one Ge modulator is disposed on an upper surface of the trench, one free end of the Ge modulator is level with one lateral side of the trench, the other free end of the Ge modulator is joined with the short side of the Si conical body, the long side of the Si conical body is joined with the SOI waveguide, and the SOI waveguide is level with the other lateral side of the trench.

6. The highly integrated multi-channel optical transceiver module of a silicon photonic chip according to claim 2, wherein the thermal-insulation V-shaped groove fixed optical fiber array is integrated on the silicon photonic transmitter chip or the silicon photonic receiver chip, the thermal-insulation V-shaped groove optical fiber connector array comprises several V-shaped grooves, one SOI waveguide is disposed in each V-shaped groove, and the coupling loss between each single-mode optical fiber in the V-shaped groove and the SOI waveguide is less than 1 dB.

7. The highly integrated multi-channel optical transceiver of a silicon photonic chip according to claim 2, wherein the Ge waveguide optoelectronic detector array is integrated on the silicon photonic receiver chip, the Ge waveguide optoelectronic detector array is compatible with a CMOS amplifier, an RF bandwidth is less than 40 GHz, and the wavelength detection range is between 1270 nm and 1600 nm.

8. The highly integrated multi-channel optical transceiver of a silicon photonic chip according to claim 2, wherein the Ge/Si electro-absorption modulator driver array consists of a CDR and a 28-nm CMOS amplifier integrated on a silicon-based chip, and supports a 4×25-Gbps NRZ rectification signal input function and a 4×25-Gbps NRZ signal output function.

9. The highly integrated multi-channel optical transceiver of a silicon photonic chip according to claim 2, wherein the transimpedance amplifier integrates a CDR and a 28-nm CMOS amplifier and supports a 4×25-Gbps NRZ signal input function and a 4×25-Gbps NRZ rectification signal output function.

* * * * *